(12) United States Patent
Blecha

(10) Patent No.: US 6,916,009 B2
(45) Date of Patent: Jul. 12, 2005

(54) LOAD-LOCK DEVICE FOR INTRODUCING SUBSTRATES INTO A VACUUM CHAMBER

(75) Inventor: Thomas Blecha, Feldkirch (AT)

(73) Assignee: VAT Holding AG, Haag (CH)

( * ) Notice: Subject to any disclaimer, the term of this patent is extended or adjusted under 35 U.S.C. 154(b) by 174 days.

(21) Appl. No.: 10/619,391

(22) Filed: Jul. 14, 2003

(65) Prior Publication Data
US 2005/0012066 A1 Jan. 20, 2005

(51) Int. Cl.$^7$ ............................................. F16K 21/00
(52) U.S. Cl. ........................ 251/158; 251/187; 414/221
(58) Field of Search ................................ 251/158, 175, 251/187, 193; 414/221

(56) References Cited

U.S. PATENT DOCUMENTS

| | | | |
|---|---|---|---|
| 5,914,493 A | * 6/1999 | Morita et al. | ............ 250/492.2 |
| 6,056,266 A | 5/2000 | Blecha | |
| 6,427,973 B1 | 8/2002 | Wagner | |
| 6,488,262 B1 | * 12/2002 | Oka | ........................... 251/193 |

FOREIGN PATENT DOCUMENTS

DE 196 33 798 2/1998

* cited by examiner

Primary Examiner—Edward K. Look
Assistant Examiner—John K. Fristoe, Jr.
(74) Attorney, Agent, or Firm—Reed Smith LLP

(57) ABSTRACT

A load-lock device for introducing substrates into a vacuum chamber comprises a load-lock chamber with at least one opening on the input side for introducing the substrates from an atmosphere area located in front of the input-side opening into an interior space located inside the load-lock chamber, and at least one opening on the output side for connecting the interior space of the load-lock chamber to the interior space of a vacuum chamber with the intermediary of a valve; at least one vacuum door which is associated with a respective opening on the input side and which comprises a closure-element which communicates with a drive device via at least one carrier rod and is adjustable by the drive device between a position in which the input-side opening is open and a position in which the input-side opening is closed and in which the closure element contacts a contact surface of the load-lock chamber, wherein, considered from the atmosphere area located in front of the input-side opening, the drive device is arranged behind a plane which extends through the contact surface of the load-lock chamber and lies vertical to the axis of the input-side opening.

12 Claims, 5 Drawing Sheets

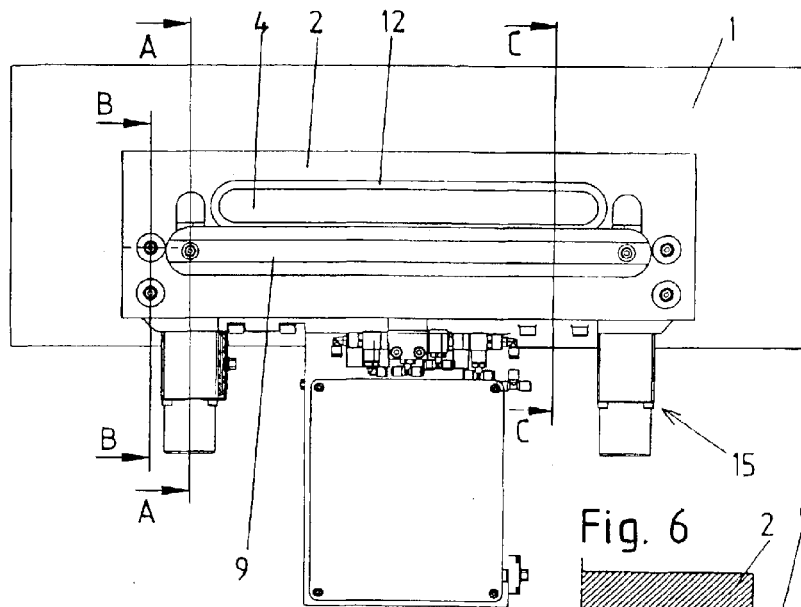
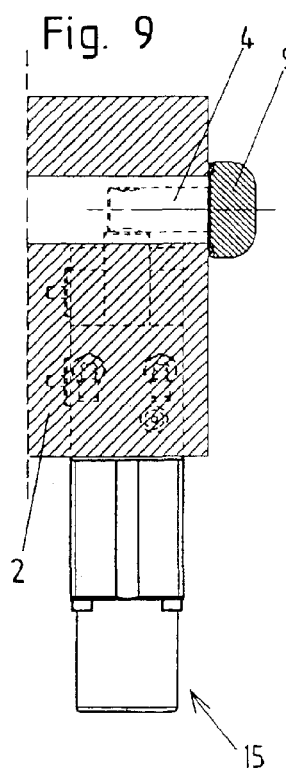
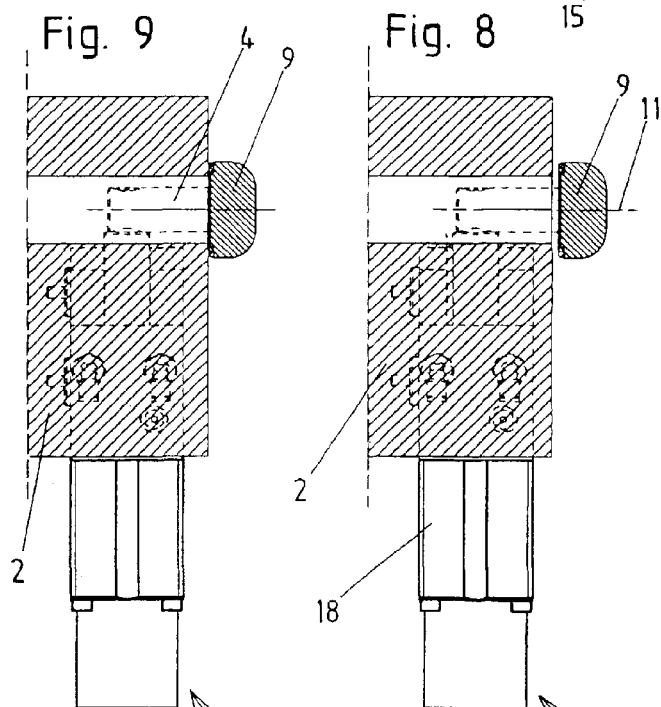
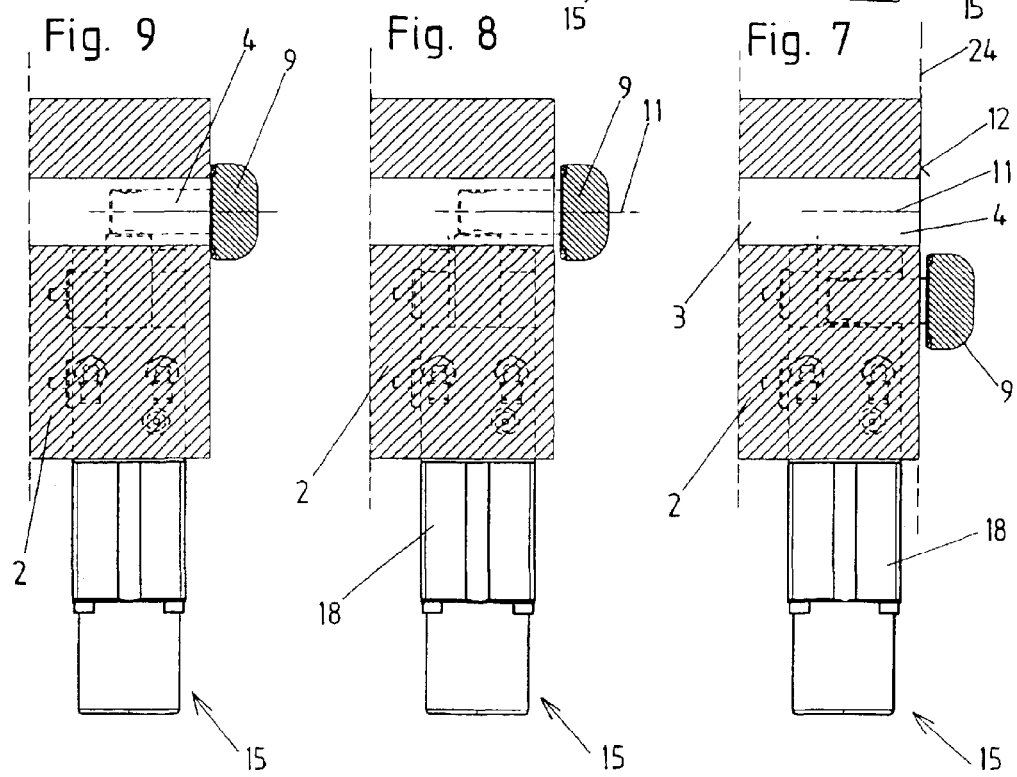
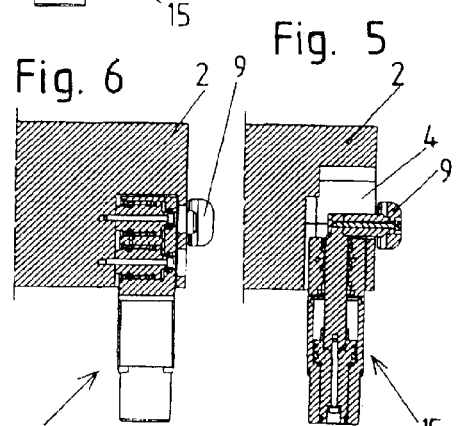

LOAD-LOCK DEVICE FOR INTRODUCING SUBSTRATES INTO A VACUUM CHAMBER

BACKGROUND OF THE INVENTION a) Field of the Invention

The invention is directed to a load-lock device for introducing substrates into a vacuum chamber, comprising a load-lock chamber with at least one opening on the input side for introducing the substrate from an atmosphere area located in front of the input-side opening into an interior space located inside the load-lock chamber, and at least one opening on the output side for connecting the interior space of the load-lock chamber to the interior space of a vacuum chamber with the intermediary of a valve; at least one vacuum door which is associated with a respective opening on the input side and which comprises a closure element which communicates with a drive device via at least one carrier rod and is adjustable by the drive device between a position in which the input-side opening is open and a position in which the input-side opening is closed and in which the closure element contacts a contact surface of the load-lock chamber.

b) Description of the Related Art

Load-lock devices of the type mentioned above are known. In particular, load-lock devices of this type are used in production plants producing semiconductors. These load-lock devices are used for introducing substrates (workpieces) from the atmosphere into the vacuum area of the installation. In semiconductor technique, these substrates are particularly wafers, e.g., silicon wafers.

Different types of conventional slide valves and plate valves are arranged between the output-side opening of the load-lock chamber and the vacuum chamber.

The load-lock chamber has a vacuum door for closing the input-side opening of the load-lock chamber. Vacuum doors of this type are known, for example, from U.S. Pat. No. 6,056,266 A or DE 196 33 798 A1. In the apparatus of the former reference, there are two piston-cylinder units by means of which an L-shaped movement sequence of the valve plate is carried out. In the apparatus of the latter reference, a housing is supported so as to be swivelable relative to the wall in which the opening is arranged. First cylindrical bore holes are formed in the housing, pneumatic pistons whose piston rods carry the valve plate being mounted therein so as to be displaceable. The valve plate is displaced by these pistons between an open position in which the opening is released and a position in which the opening is covered, but which is raised from the wall. Further, second cylindrical bore holes are provided in the housing, and pneumatic pistons serving to swivel the housing are displaceably supported in these second cylindrical bore holes. By actuating these pneumatic pistons, the housing can be swiveled, so that the valve plate is pressed against the wall and the opening is closed so as to be vacuum-tight.

Another closure device for the vacuum closure of at least one opening in a wall is known from U.S. Pat. No. 6,427,973 B1. This closure device is also suited in particular for closing and opening a plurality of slot-shaped openings. The closure plates execute L-shaped movements between their open position and their closed position.

In semiconductor technology, for example, it is often required that the substrates are contaminated by deposition of particles as little as possible while being introduced into the vacuum chamber. For this purpose, the atmosphere area in front of the input-side opening must be charged with as few particles are possible. For this purpose, the vacuum installation can be located in a cleanroom. Further, an air flow of filtered air flowing vertical to the axis of the opening on the input side is often guided through the atmosphere area located in front of the input-side opening.

In conventional load-lock devices, it is disadvantageous that the components of the vacuum door that are arranged in the area in front of the input-side opening interfere relatively severely with the laminar flow of an air flow that is guided past this area, especially by forming whirling and/or blocking which reduces the efficiency of the air flow in keeping the surfaces of the substrates clean. Also, particles are generated (by friction between two parts) by the parts of the drive device of the vacuum door moving against one another in this area and these particles can settle on the substrate. The drive device of the vacuum door usually has pneumatic piston-cylinder units. These can leak more or less extensively, so that pneumatic air charged with particles can exit and can result in disadvantageous particle deposits on the substrates.

OBJECT AND SUMMARY OF THE INVENTION

It is the primary object of the invention to provide a load-lock device in which there is less interference in the air flow which is guided past the area in front of the input-side opening, which air flow is preferably as laminar as possible. It is another object of the invention to provide a load-lock device in which as few particles as possible are generated in the atmosphere area located in front of the input-side opening.

A load-lock device, according to the invention, for introducing substrates into a vacuum chamber comprises a load-lock chamber with at least one opening on the input side for introducing the substrates from an atmosphere area located in front of the input-side opening into an interior space located inside the load-lock chamber, and at least one opening on the output side for connecting the interior space of the load-lock chamber to the interior space of a vacuum chamber with the intermediary of a valve; at least one vacuum door which is associated with a respective opening on the input side and which comprises a closure element which communicates with a drive device via at least one carrier rod and is adjustable by the drive device between a position in which the input-side opening is open and a position in which the input-side opening is closed and in which the closure element contacts a contact surface of the load-lock chamber, wherein, considered from the atmosphere area located in front of the input-side opening, the drive device is arranged behind a plane which extends through the contact surface of the load-lock chamber and lies vertical to the axis of the input-side opening.

Due to the inventive arrangement of the drive device there are fewer structural component parts in the atmosphere area located in front of the input-side opening, so that there is less interference with the air flow that is guided past that area. For this purpose, the remaining structural component parts arranged in front of the input-side opening, particularly the at least one closure element and an end portion of the at least one carrier rod carrying the closure element, can have an advantageous aerodynamic arrangement.

Due to the inventive arrangement of the drive device, the generation of particles resulting from parts moving against one another takes place in an area that is farther from the atmosphere area which is situated in front of the input-side opening and through which the substrate is guided, thus reducing the risk of deposits on the substrates.

This also applies to the air containing particles and exiting from pneumatic leaks in the pneumatic piston-cylinder units preferably comprised by the drive unit. In addition, in an advantageous embodiment form of the invention, an at least partial spacing is carried out by the at least one cover plate.

Further advantages and details of the invention are explained in the following with reference to the preferred embodiment example shown in the drawing, additional objects of the invention following therefrom.

BRIEF DESCRIPTION OF THE DRAWINGS

In the drawings:

FIG. 4 shows a front view of the load-lock device connected to the vacuum chamber via a valve, in the open state of the vacuum door;

FIG. 5 shows a partial section along line AA of FIG. 4;

FIG. 6 shows a partial section along line BB of FIG. 4;

FIG. 7 shows a partial section along line CC of FIG. 4;

FIG. 8 shows a section corresponding to FIG. 7, but in the position in which the closure element is located opposite from the input-side opening and in which it is raised from the load-lock chamber;

FIG. 9 shows a section corresponding to FIG. 7, but in the completely closed state of the vacuum door;

DESCRIPTION OF THE PREFERRED EMBODIMENTS

Figure 1:
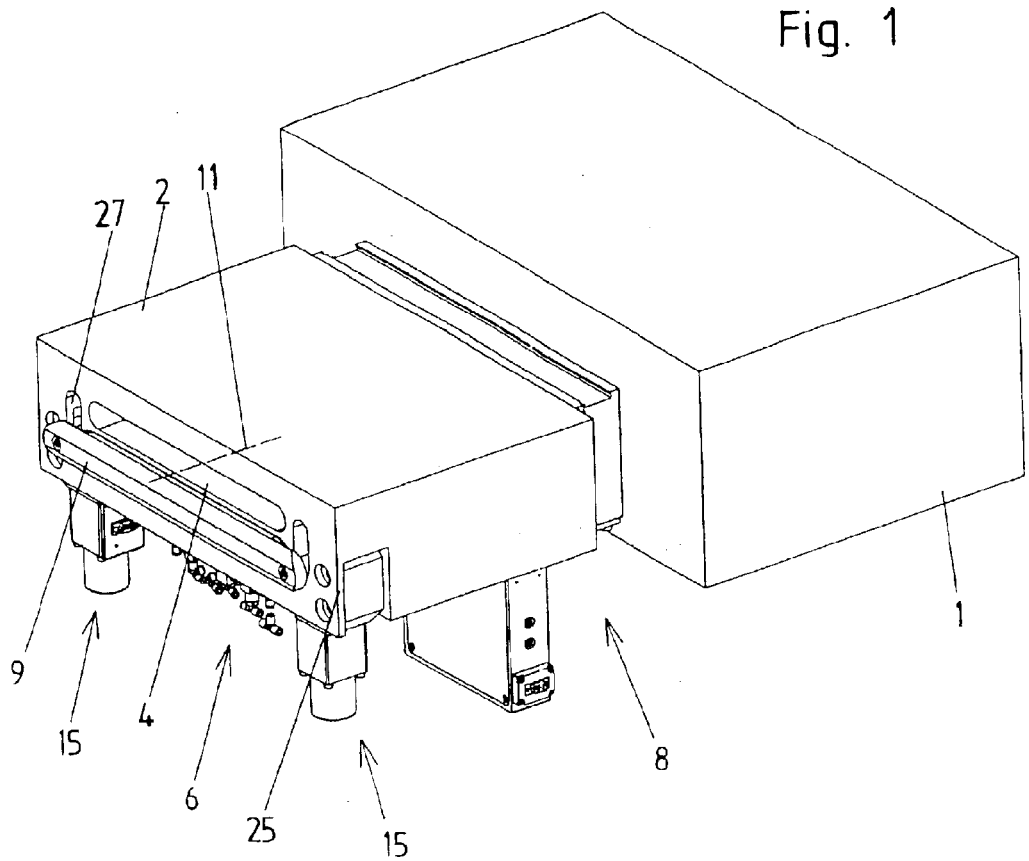
FIG. 1 shows a perspective view of a load-lock device according to the invention as seen obliquely from the top, wherein the load-lock device is connected to a vacuum chamber via a valve.
Figure 2:
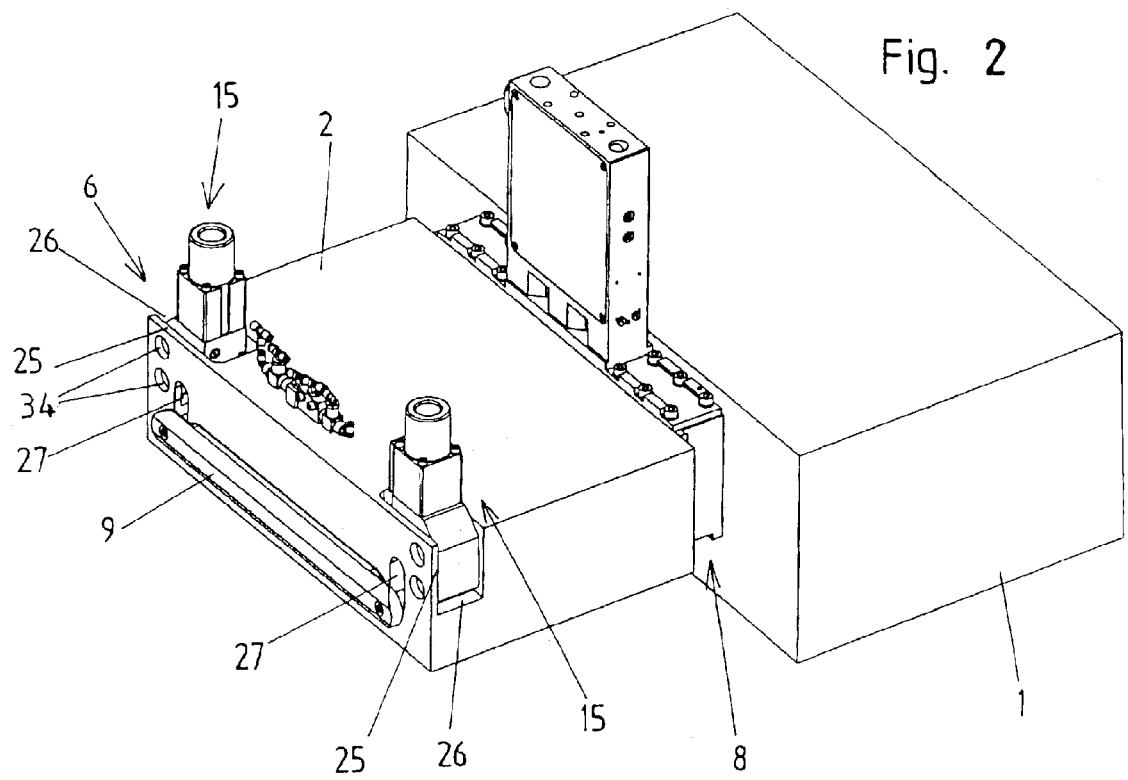
FIG. 2 shows a perspective view of the load-lock device and the vacuum chamber viewed obliquely from the bottom in the closed state of the vacuum door.

FIGS. 1 to 4 show a load-lock device, according to the invention, in the state in which it is connected to a vacuum chamber 1 by a valve. The load-lock device comprises a load-lock chamber 2 which has an interior space 3 with an input-side opening 4 and an output-side opening 5, as well as a vacuum door 6 which cooperates with the opening 4 on the input side.

The valve 8 is arranged between the output-side opening 5 and an opening in the interior space 7 of the vacuum chamber 1. The valve 8 can be constructed in the form of a conventional vacuum valve, particularly as a plate valve or slide valve, and therefore need not be described in detail within the framework of the present application.

The vacuum door 6 has a plate-shaped closure element 9 at which a carrier rod 10 is arranged in the area of its two side edges. The carrier rods 10 extend from the closure element 9 in the direction of the output-side opening 5 of the load-lock chamber 2 or in the direction of the vacuum chamber 1. In the present embodiment example, the carrier rods 10 extend parallel to the axis 11 of the input-side opening 4. The carrier rods 10 are connected to piston rods 13 of first piston-cylinder units 14 of the drive units 15 at their ends remote of the plate-shaped closure element 9. The two drive units 15 together form the drive device for the vacuum door 6. Each of the two drive units 15 has a first piston-cylinder unit 14 and two second piston-cylinder units 16.

The second piston-cylinder units 16 serve to press the closure element 9 against a contact surface 12 of the load-lock chamber 2 which is arranged in the area around the input-side opening 4 and for lifting the closure element 9 from the load-lock chamber 2. The piston rods 17 of the second piston-cylinder units 16 project from the housing 18 of the drive unit 15 by only a relatively small distance and have a front end 19 with a relatively large diameter. The pistons 20 of the second piston-cylinder units 16 likewise have short piston rods 21 on the opposite side which are sealed relative to the housing 18 like piston rods 17. Piston rods 17, 21 and piston 20 are penetrated by a through-hole through which a fastening screw 22 projects. The drive units 15 are screwed to the load-lock chamber 2 by these fastening screws 22.

The drive device of the vacuum door 6 is arranged behind the plane 24 considered from the atmosphere area 23 in front of the input-side opening 4. This plane 24 extends through the contact surface 12 at which the closure element 9 contacts the load-lock chamber 2 and extends vertical to the axis 11 of the input-side opening 4. The drive units 15 of the drive device are partially concealed by the cover plates 25 viewed from the atmosphere area 23 located in front of the input-side opening 4. These cover plates 25 are formed in one piece with the load-lock chamber 2 in the embodiment example shown in the drawing. For this purpose, recesses 26 which open at least toward the bottom and/or top of the load-lock chamber 2 are introduced in the load-lock chamber. The drive units 15 are inserted in these recesses, and an area of the housing 18 of the respective drive unit 15 adjoining the exit location of the piston rod 13 lies in this recess 26. Elongated holes 27 through which the carrier rods 10 project are inserted in the cover plates 25.

It would also be conceivable and possible in principle, particularly when the input-side opening 4 is not as wide as in the present embodiment example, to provide only one individual drive unit arranged in the center. In this case, only one individual carrier rod could be provided at the piston rod of the first piston-cylinder unit 14 on the one hand and at the closure element 9 on the other hand. This carrier rod could then engage in the center of the closure element 9 and initially have a portion extending parallel to the plane 24 and then a portion which extends vertical to the plane 24 and which is fastened to the piston rod by its end remote of the first portion.

Figure 14:
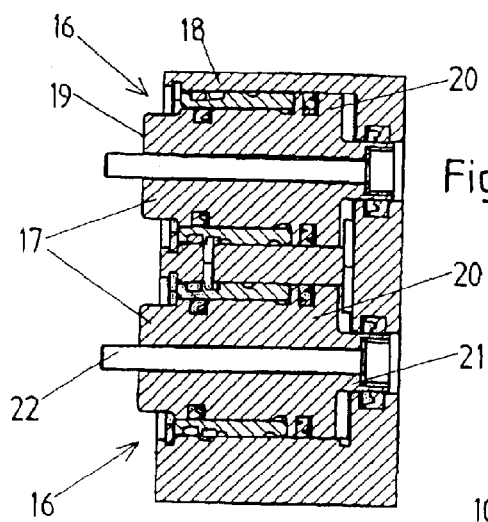
FIG. 14 shows a section corresponding to FIG. 13, but in the state of the drive unit which corresponds to the position in which the closure element is raised from the load-lock chamber.
Figure 13:
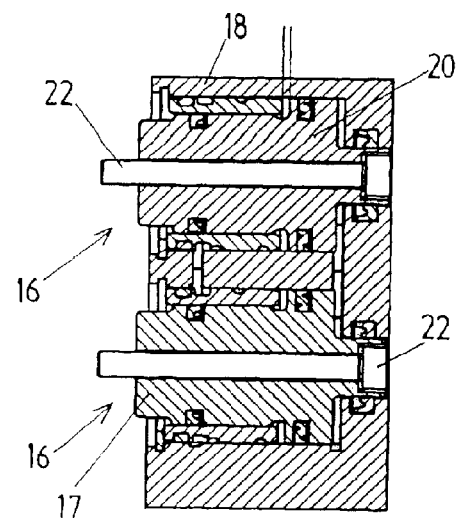
FIG. 13 shows a section along line EE of FIG. 11.
Figure 15:
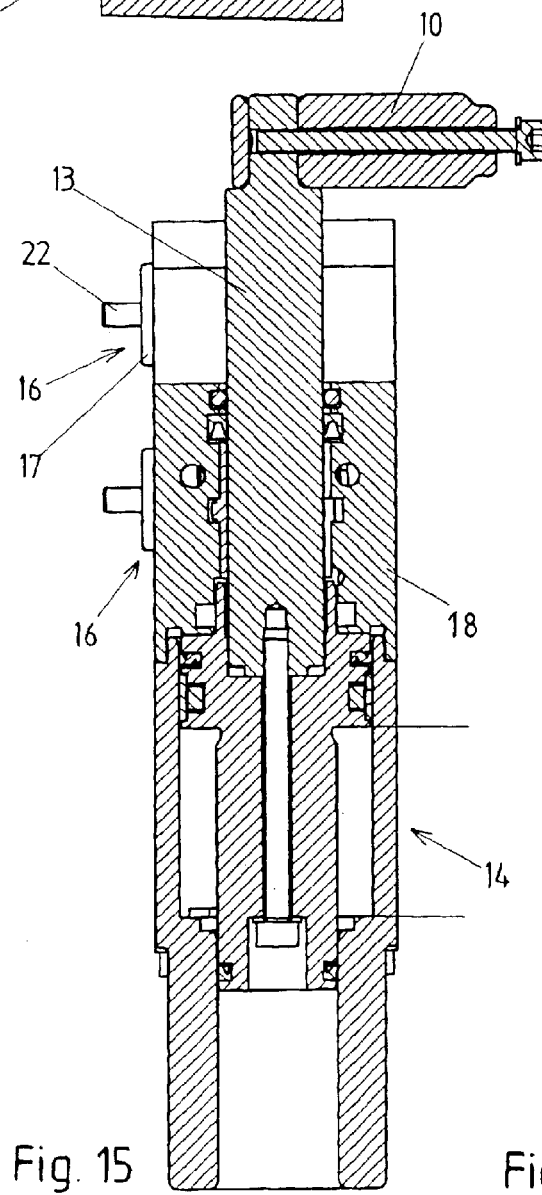
FIG. 15 shows a section along line DD of FIG. 11.
Figure 16:
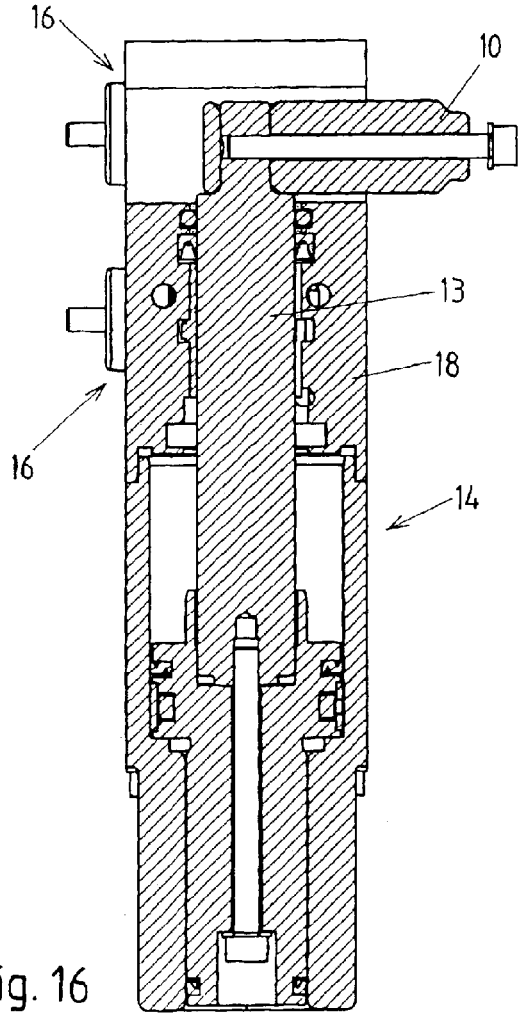
FIG. 16 shows a section corresponding to FIG. 15, but in the state of the drive unit corresponding to the completely open position of the closure element.

In order to close the vacuum door 6 starting from the position of the closure element 9 shown in FIG. 7, the first piston-cylinder units 14 of the drive units 15 are initially actuated by compressed air, so that they change from the state shown in FIG. 16 to the state shown in FIG. 15. The closure element then occupies the position shown in FIG. 8 in which it is located opposite from the input-side opening 4 but is raised from the contact surface 12 of the load-lock chamber 2. The second piston-cylinder units 16 are then actuated by compressed air, so that they change from the state shown in FIG. 14 to the state shown in FIG. 13. The closure element 9 is accordingly placed against the outer surface 12 of the load-lock chamber 2 and the input-side opening 4 is closed so as to be vacuum-tight as is shown in FIG. 9.

Additional holes 34 are formed in the cover plates 25 next to the elongated holes 27; the fastening screws 22 of the drive units 15 can be inserted through these additional holes 34 and screwed to the load-lock chamber 2.

Figure 3:
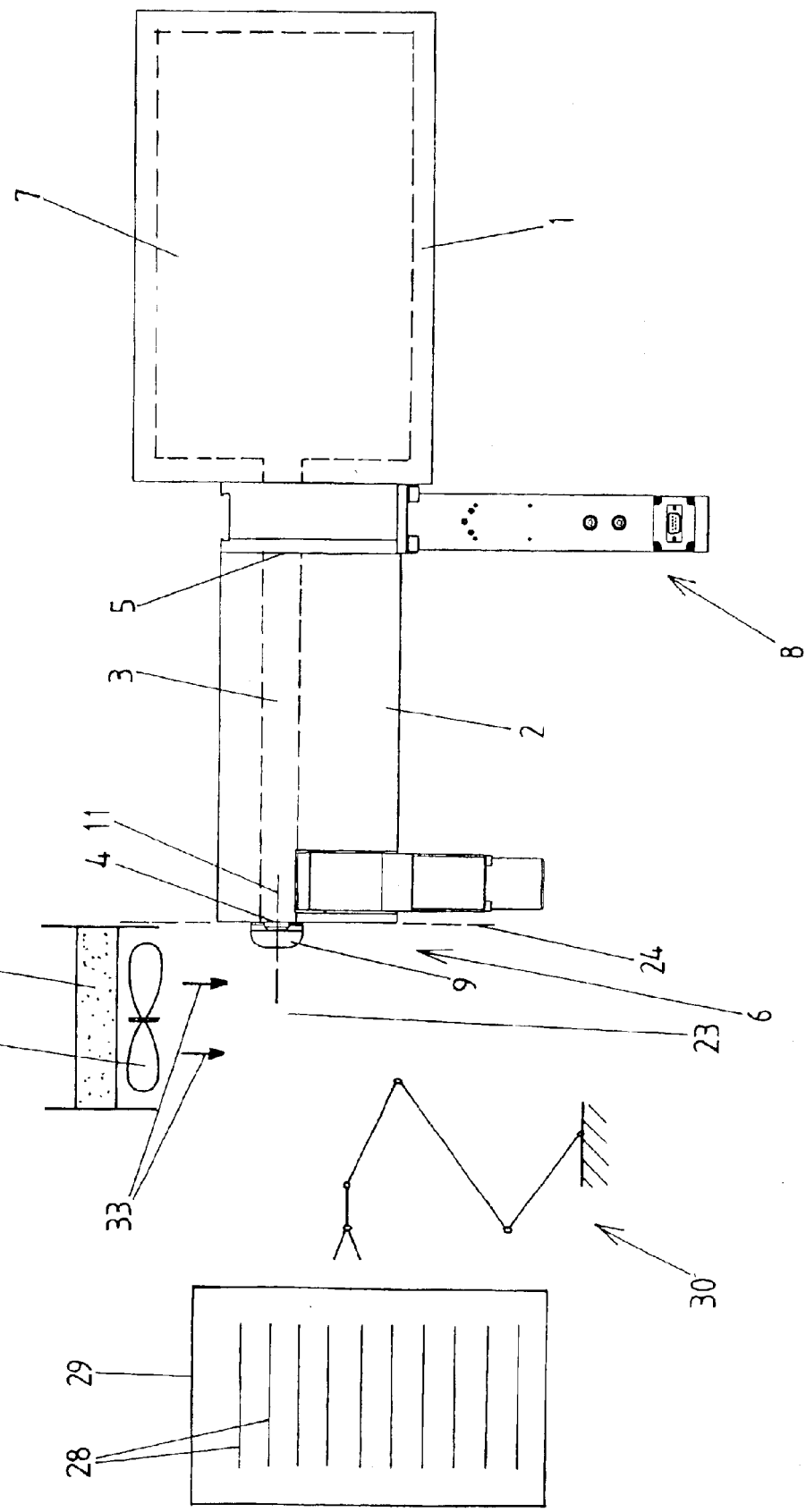
FIG. 3 shows a schematic side view of the load-lock device and vacuum chamber, wherein the inner walls of the load-lock chamber and vacuum chamber are indicated by dashes, and parts of a vacuum installation which are arranged in front of the load-lock chamber, in connection with which a load-lock device according to the invention is used.
Figure 10:
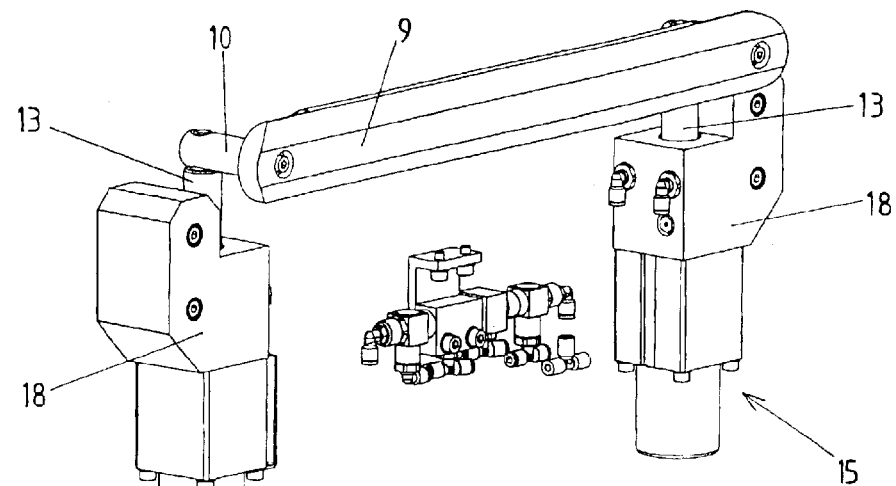
FIG. 10 shows a perspective view of the closure element with carrier rods arranged at the latter and drive units of the drive device connected with the carrier rods.
Figures 11, 12:
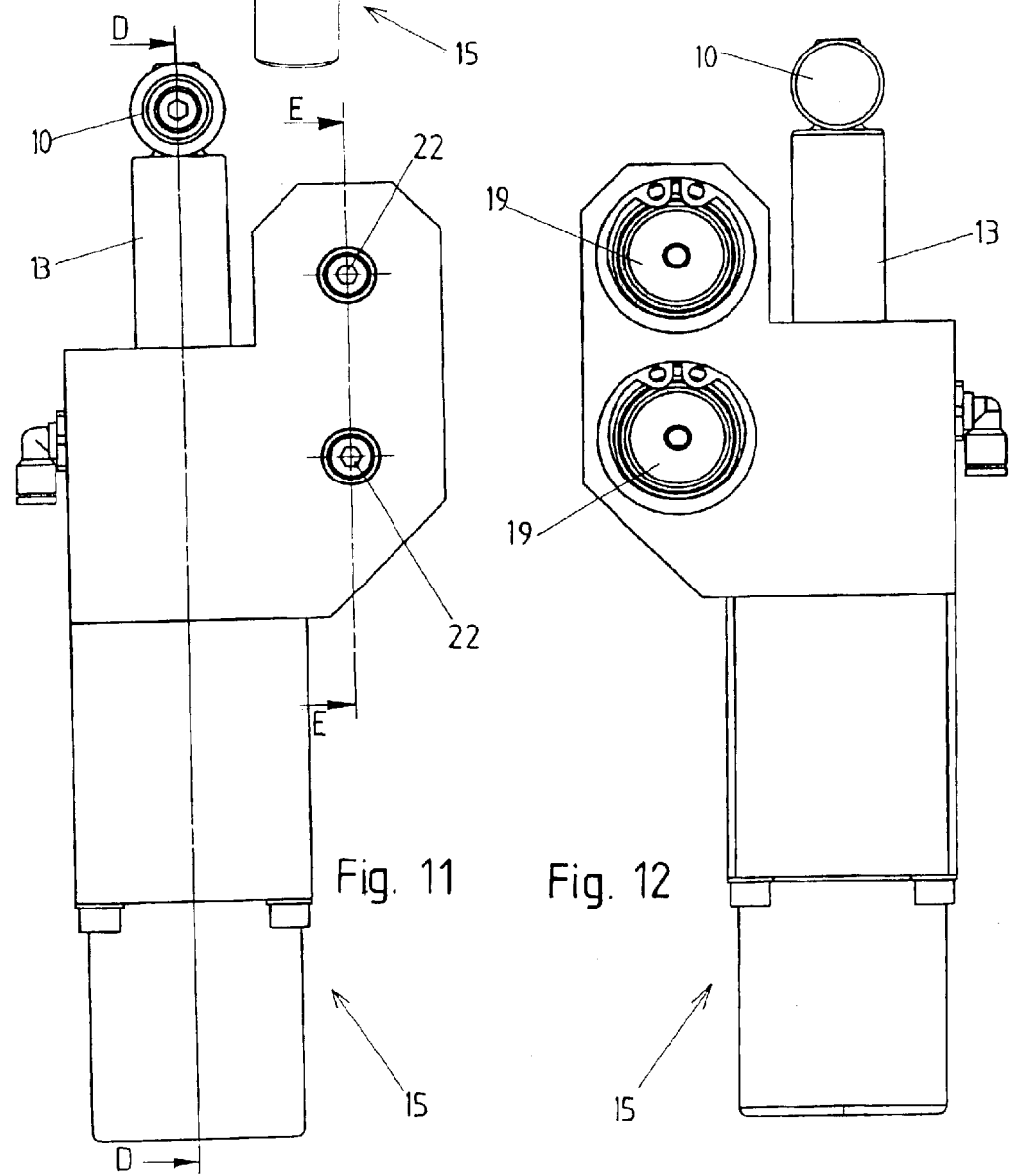
FIG. 11 is a view of a drive unit and of the carrier rod arranged at the latter.
FIG. 12 shows a view of the opposite side.

Further, FIG. 3 shows schematically a box 29 having substrates 28, for example, wafers, and a manipulating robot 30. The manipulating robot 30 removes a substrate 28 from the box 29 and guides it into the input-side opening 4 of the load-lock chamber 2 when the closure element 9 is opened. The vacuum door 6 is then closed and the valve 8 is opened, whereupon a gripper can move from the vacuum chamber 1 into the interior space of the load-lock chamber and can take over the substrate 28.

When the least possible amount of air is to be allowed into the vacuum chamber, the load-lock chamber 2 can be provided with a pump-off line which is connected to a corresponding pump.

A blower 31 with a filter device 32 is shown schematically in FIG. 3. An air flow indicated schematically by arrow 33 is accordingly formed in the atmosphere area 23 located in front of the input-side opening 4. The air flow is as laminar as possible, that is, it should not have any whirling. The closure element 9 and the carrier rods 10 are provided with an aerodynamic shape at least in their portions located between the closure element 9 and the plane 24. The closure element 9 and the portions of the carrier rods 10 next to the closure element are the only parts of the vacuum door 6 that are arranged in the atmosphere area located in front of the input-side opening 4, i.e., on the side of the plane 24 remote of the vacuum chamber 1.

It would also be conceivable and possible to omit the elongated holes 27, in which case the carrier rods 10 could be guided around the cover plates 25 and could pass through the plane 24 to the side of the cover plates. Further, it would also be conceivable and possible for the drive units 15 to be at the sides of the load-lock chamber 2 rather than in recesses 26. In this case, cover plates would preferably be provided again and would at least partially conceal the drive units considered from the atmosphere area 23 located in front of the input-side opening 4.

A load-lock device according to the invention can also have more than one input-side opening 4 of the load-lock chamber 2. In this case, a corresponding quantity of output-side openings 5 is preferably provided. In this case, a corresponding quantity of separate interior spaces 7 would preferably be provided and could be formed as continuous slots between the input-side opening 4 and the output-side opening 5 as in the present embodiment example. In case of a plurality of input-side openings 4, they would preferably be closed by separate vacuum doors 6. In case of two input-side openings 4, the two vacuum doors 6 could be formed in a mirror-inverted manner with respect to a horizontal plane. In this case, the upper vacuum door could appear as in the view shown in FIG. 2 obliquely from the top. Drive units 15 could also be arranged one behind the other in direction of axis 11, and the carrier rods 10 which are connected to the drive units 15 arranged farther from the plane 24 would be constructed correspondingly longer. By combining drive units arranged one behind the other and drive units in a mirror arrangement, four or six vacuum doors 6, for example, could also be formed for a corresponding quantity of input-side openings 4.

Although drive units having pneumatic piston-cylinder units are preferred, other drive units could also be used in principle, for example, electromechanically operated drive units.

The L-movement of the closure elements 9 could also be achieved by other arrangements of piston-cylinder units 14, 16, for example, in the manner described in the introductory part of the specification in U.S. Pat. No. 6,056,266 A.

It would also be conceivable and possible in principle to achieve an L-shaped movement of a closure element with only one individual piston-cylinder unit per drive unit; corresponding link guides could be used for this purpose, for example. Vacuum valves with drive units constructed in such a way are known.

In the present embodiment example, the load-lock chamber 2 is constructed in one piece from a whole. While a simple and advantageous production is made possible in this way, a construction in multiple parts is also conceivable and possible.

As follows from the preceding description, the field of the invention is not limited to the embodiment examples shown herein, and different modifications are possible for the person skilled in the art without departing from the field of the invention.

While the foregoing description and drawings represent the present invention, it will be obvious to those skilled in the art that various changes may be made therein without departing from the true spirit and scope of the present invention.

REFERENCE NUMBERS 1 vacuum chamber
2 load-lock chamber
3 interior space
4 input-side opening
5 output-side opening
6 vacuum door
7 interior space
8 valve
9 closure element
10 carrier rod
11 axis
12 contact surface
13 piston rod
14 first piston-cylinder unit
15 drive unit
16 second piston-cylinder unit
17 piston rod
18 housing
19 front end
20 piston
21 piston rod
22 fastening screw
23 atmosphere area
24 plane
25 cover plate
26 recess 27 elongated hole
28 substrate
29 box
30 manipulating robot
31 blower
32 filter device
33 arrow
34 hole

What is claimed is:

1. A load-lock device for introducing substrates into a vacuum chamber, comprising:

a load-lock chamber having at least one opening on the input side for introducing the substrates from an atmosphere area located in front of the input-side opening into an interior space located inside a load-lock chamber, and at least one opening on the output side for connecting the interior space of the load-lock chamber to the interior space of a vacuum chamber with the intermediary of a valve;

at least one vacuum door which is associated with a respective opening on the input side and which comprises a closure element which communicates with a drive device via at least one carrier rod and is adjustable by the drive device between a position in which the input-side opening is open and a position in which the input-side opening is closed;

said closure element contacting a contact surface of the load-lock chamber;

wherein, considered from the atmosphere area located in front of the input-side opening, the drive device is arranged behind a plane which extends through the contact surface of the load-lock chamber and lies vertical to the axis of the input-side opening.

2. The load-lock device according to claim 1, wherein the drive device is at least partially concealed by at least one cover plate viewed from the atmosphere area located in front of the input-side opening.

3. The load-lock device according to claim 2, wherein a hole through which a portion of the carrier rod extending in the direction of the vacuum chamber projects is arranged in the at least one cover plate.

4. The load-lock device according to claim 2, wherein the front side of the at least one cover plate facing the atmosphere area located in front of the input-side opening and the contact surface of the load-lock chamber lie at least substantially in a common plane.

5. The load-lock device according to claim 2, wherein the at least one cover plate and the load-lock chamber are formed in one piece.

6. The load-lock device according to claim 5, wherein the drive device is arranged at least partially in at least one recess which is arranged in the load-lock chamber, adjoins the cover plate in the direction of the vacuum chamber and is open at least toward the bottom or the top of the load-lock chamber.

7. The load-lock device according to claim 1, wherein the drive device has at least one pneumatic piston-cylinder unit.

8. The load-lock device according to claim 1, wherein the at least one carrier rod extends in the direction of the vacuum chamber at least in some areas considered from the closure element to the drive unit.

9. The load-lock device according to claim 1, wherein two carrier rods are arranged at the closure element in the area of side edges of the same.

10. The load-lock device according to claim 1, wherein the drive device has at least one drive unit which comprises first and second piston-cylinder units, wherein the piston rod of the first piston-cylinder unit is connected to the carrier rod or one of the carrier rods, and the closure element is adjustable by means of the first piston-cylinder unit between a position in which the input-side opening is open and a position in which the closure element is located opposite the input-side opening but is lifted from the load-lock chamber, and the closure element is adjustable by means of the at least one second piston-cylinder unit between the position in which the closure element is located opposite the input-side opening but is lifted from the load-lock chamber and a completely closed position in which the closure element contacts the load-lock chamber.

11. The load-lock device according to claim 10, wherein two such drive devices are provided.

12. The load-lock device according to claim 1, wherein an air flow extending vertical to the axis of the input-side opening is guided in the atmosphere area located in front of the input-side opening.

* * * * *